United States Patent
Huang

(10) Patent No.: US 10,565,207 B2
(45) Date of Patent: Feb. 18, 2020

(54) METHOD, SYSTEM AND PROGRAM PRODUCT FOR MASK-BASED COMPRESSION OF A SPARSE MATRIX

(71) Applicant: Hsilin Huang, Cupertino, CA (US)

(72) Inventor: Hsilin Huang, Cupertino, CA (US)

( * ) Notice: Subject to any disclaimer, the term of this patent is extended or adjusted under 35 U.S.C. 154(b) by 330 days.

(21) Appl. No.: 15/485,036

(22) Filed: Apr. 11, 2017

(65) Prior Publication Data

US 2017/0293659 A1 Oct. 12, 2017

Related U.S. Application Data

(60) Provisional application No. 62/321,683, filed on Apr. 12, 2016, provisional application No. 62/322,802, filed on Apr. 15, 2016, provisional application No. 62/323,699, filed on Apr. 17, 2016.

(51) Int. Cl.
*G06F 17/30* (2006.01)
*G06F 16/2455* (2019.01)

(52) U.S. Cl.
CPC .............. *G06F 16/24561* (2019.01)

(58) Field of Classification Search
CPC . G06F 16/24561; H03M 7/30; H03M 7/3066; H03M 7/3082; H03M 7/70
USPC ......................................................... 707/693
See application file for complete search history.

(56) References Cited

U.S. PATENT DOCUMENTS

| | | | | |
|---|---|---|---|---|
| 5,206,822 A | * | 4/1993 | Taylor | G06F 15/8061 708/607 |
| 5,267,185 A | * | 11/1993 | Akabane | G06F 17/16 708/520 |
| 5,664,172 A | * | 9/1997 | Antoshenkov | G06F 16/24524 707/700 |
| 5,781,779 A | * | 7/1998 | Gilbert | G06F 17/16 708/520 |
| 5,905,666 A | * | 5/1999 | Hoffman | G06F 17/16 700/99 |
| 6,243,734 B1 | * | 6/2001 | Doshi | G06F 17/16 708/607 |
| 6,439,783 B1 | * | 8/2002 | Antoshenkov | G06F 16/24524 |
| 8,775,495 B2 | * | 7/2014 | Lumsdaine | G06F 17/16 708/520 |
| 2007/0198621 A1 | * | 8/2007 | Lumsdaine | G06F 17/16 708/200 |
| 2017/0090924 A1 | * | 3/2017 | Mishra | G06F 9/30018 |

* cited by examiner

*Primary Examiner* — Sheree N Brown
(74) *Attorney, Agent, or Firm* — Ariel S. Bentolila; Bay Area IP Group, LLC

(57) ABSTRACT

A method, system and program product includes examining elements of a first matrix in a sequential fashion. Values of the examined elements are determined. A corresponding bit of a first mask is set to a first value if a determined value is zero. A corresponding bit of a first mask is set to a second value if a determined value is non-zero. The non-zero values are packed in a first vector, wherein bits of at least the first mask determine operations on packed values.

17 Claims, 21 Drawing Sheets

105

|  10 | 0 | 0 | 0 | -2 | 0 |
| --- | --- | --- | --- | --- | --- |
|  3 | 9 | 0 | 0 | 0 | 3 |
|  0 | 7 | 8 | 7 | 0 | 0 |
|  3 | 0 | 8 | 7 | 5 | 0 |
|  0 | 8 | 0 | 9 | 9 | 13 |
|  0 | 4 | 0 | 0 | 2 | -1 |

| val | 10 | -2 | 3 | 9 | 3 | 7 | 8 | 7 | 3 | 8 | 7 | 5 | 8 | 9 | 9 | 13 | 4 | 2 | -1 |
| --- | --- | --- | --- | --- | --- | --- | --- | --- | --- | --- | --- | --- | --- | --- | --- | --- | --- | --- | --- |
| Col_ind | 0 | 4 | 0 | 1 | 5 | 1 | 2 | 3 | 0 | 2 | 3 | 4 | 1 | 3 | 4 | 5 | 1 | 4 | 5 |

| Row_ptr | 0 | 2 | 5 | 8 | 12 | 16 | 19 |
| --- | --- | --- | --- | --- | --- | --- | --- |

| 10 | 0 | 0 | 0 | -2 | 0 |
| --- | --- | --- | --- | --- | --- |
| 3 | 9 | 0 | 0 | 0 | 3 |
| 0 | 7 | 8 | 7 | 0 | 0 |
| 3 | 0 | 8 | 7 | 5 | 0 |
| 0 | 8 | 0 | 9 | 9 | 13 |
| 0 | 4 | 0 | 0 | 2 | -1 |

| val | 10 | -2 | 3 | 9 | 3 | 7 | 8 | 7 | 3 | 8 | 7 | 5 | 8 | 9 | 9 | 13 | 4 | 2 | -1 |
| --- | --- | --- | --- | --- | --- | --- | --- | --- | --- | --- | --- | --- | --- | --- | --- | --- | --- | --- | --- |

| 1 | 0 | 0 | 0 | 1 | 0 |
| --- | --- | --- | --- | --- | --- |
| 1 | 1 | 0 | 0 | 0 | 1 |
| 0 | 1 | 1 | 1 | 0 | 0 |
| 1 | 0 | 1 | 1 | 1 | 0 |
| 0 | 1 | 0 | 1 | 1 | 1 |
| 0 | 1 | 0 | 0 | 1 | 1 |

| 10 | 0 | 0 | 0 | 0 | 0 | 0 | 0 | 0 | 0 | 0 | 0 | 2 | 0 | 0 | 0 |
|---|---|---|---|---|---|---|---|---|---|---|---|---|---|---|---|
| 0 | 0 | 0 | 0 | -3 | 0 | 0 | 0 | 0 | 0 | 0 | 0 | 0 | 0 | 1 | 0 |
| 0 | 0 | 5 | 0 | 0 | 0 | 0 | 0 | 0 | 0 | -7 | 0 | 0 | 0 | 0 | 0 |
| 0 | 0 | 0 | 0 | 0 | 0 | 0 | -9 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 11 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 4 |
| 0 | 0 | 0 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 2 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 15 | 0 | 0 | 0 | 0 | 0 | 0 | 0 | 0 | 0 | 0 | 0 | 0 |
| 0 | 0 | 0 | 0 | 0 | 0 | 0 | 0 | 0 | -17 | 0 | 0 | 0 | 0 | 0 | 0 |

| val | 10 | 2 | -3 | 1 | 5 | -7 | -9 | 11 | 4 | 3 | 2 | 15 | -17 |
|---|---|---|---|---|---|---|---|---|---|---|---|---|---|

Fig. 4b

From highest bit to lowest bit:
0101 (row 3) 1001 (row 2) 0010 (row 1) 1111 (row 0) = 0x592f

METHOD, SYSTEM AND PROGRAM PRODUCT FOR MASK-BASED COMPRESSION OF A SPARSE MATRIX

CROSS-REFERENCE TO RELATED APPLICATIONS

The present Utility patent application claims priority benefit of the [U.S. provisional application for patent Ser. No. 62/321,683 entitled "MASKED BASED COMPRESSION SCHEME AND ZERO-SKIPPING OPERATION FOR ARTIFICIAL INTELLIGENCE", filed on 12 Apr. 2016, provisional patent Ser. No. 62/322,802 entitled "A REVOLUTIONARY INSTRUCTION SEQUENCER OR CONTROLLER WITH MAS OPERATION AND ZERO-SKIPPING FOR ARTIFICAL INTELLIGENCE", filed on 15 Apr. 2016, and provisional patent Ser. No. 62/323,699 entitled "A REVOLUTIONARY MIMD PROCESSOR TH MAST OPERATION AND ZERO-SKIPPING NAD SIMD PROCESSOR FOR ARTIFICAL INTELLIGENCE" filed on 17 Apr. 2016 under 35 U.S.C. 119(e). The contents of these related provisional applications are incorporated herein by reference for all purposes to the extent that such subject matter is not inconsistent herewith or limiting hereof.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to data compression. More particularly, certain embodiments of the invention relates to mask based compression scheme.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

A typical neural network may use input data and weight to classify an object. The weight and feature map typically may be large. In numerical analysis, a sparse matrix is a matrix in which most of the elements are zero. By contrast, if most of the elements are nonzero, then the matrix is considered dense. The number of zero-valued elements divided by the total number of elements is called the sparsity of the matrix. When storing and manipulating sparse matrices on a computer, it may be beneficial and often necessary to use specialized algorithms and data structures that take advantage of the sparse structure of the matrix. Operations using standard dense-matrix structures and algorithms are believed to be slow and inefficient when applied to large sparse matrices as processing and memory are wasted on the zeroes. Sparse data is by nature more easily compressed and thus require significantly less storage.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. The Compressed Sparse Row (CSR) or Compressed Row Storage (CRS) format represents a matrix by three (one-dimensional) arrays, that respectively contain nonzero values, the extents of rows, and column indices. The Compressed Sparse Column (CSC) is similar to CSR except that values are read first by column, a row index is stored for each value, and column pointers are stored. It is believed that they are may not be very efficient, needing an indirect addressing step for every single scalar operation in a matrix-vector product or preconditioner solve.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1a, 1b and 1c illustrate an exemplary CSR format;

FIGS. 2a, 2b and 2c illustrate an exemplary compression format, in accordance with an embodiment of the present invention;

FIGS. 4a, 4b and 4c illustrate an exemplary compression format, in accordance with an embodiment of the present invention;

Figure 3:
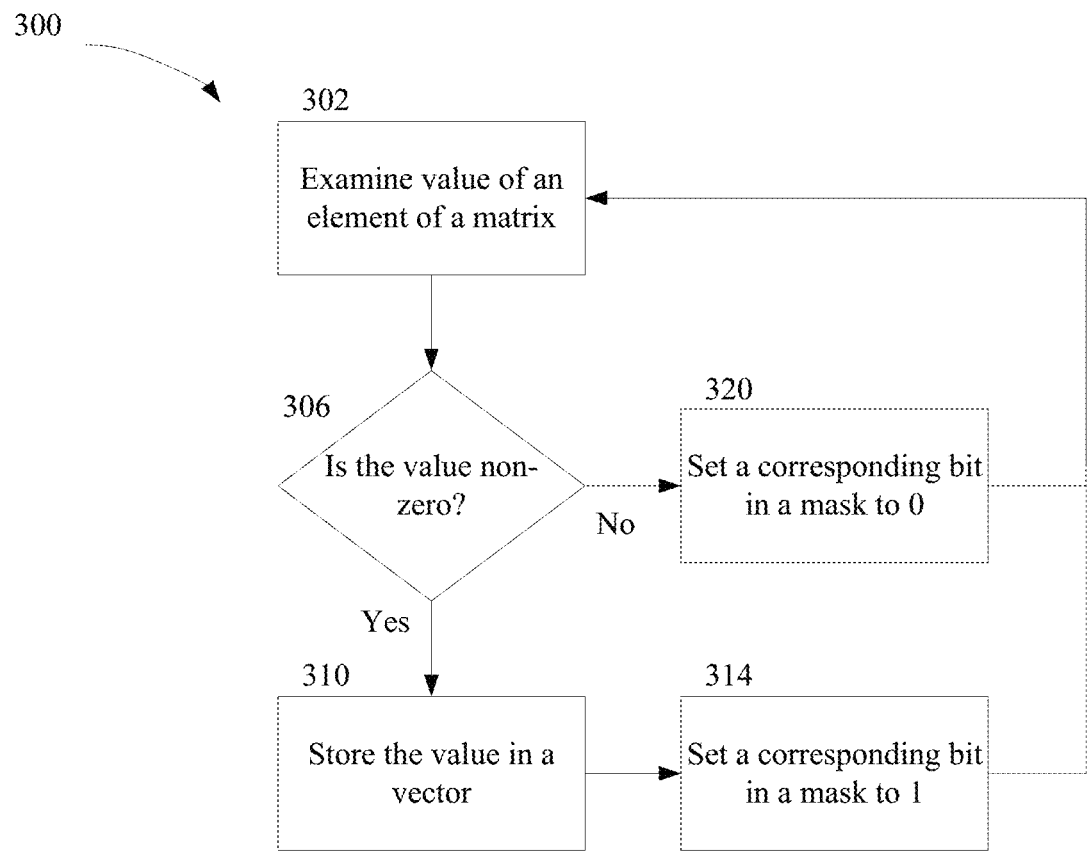
FIG. 3 illustrates an exemplary method for compression, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settle law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognize in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031

(Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of Claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs.

Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" includes the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of" and "consisting essentially of" where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, a system on a chip, or a chip set; a data acquisition device; an optical computer; a quantum computer; a biological computer; and generally, an apparatus that may accept data, process data according to one or more stored software programs, generate results, and typically include input, output, storage, arithmetic, logic, and control units.

Those of skill in the art will appreciate that where appropriate, some embodiments of the disclosure may be practiced in network computing environments with many types of computer system configurations, including personal computers, handheld devices, multi-processor systems, microprocessor-based or programmable consumer electronics, network PCs, minicomputers, mainframe computers, and the like. Where appropriate, embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

"Software" may refer to prescribed rules to operate a computer. Examples of software may include: code segments in one or more computer-readable languages; graphical and or/textual instructions; applets; pre-compiled code; interpreted code; compiled code; and computer programs.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software program code for carrying out operations for aspects of the present invention can be written in any combination of one or more suitable programming languages, including an object oriented programming languages and/or conventional procedural programming languages, and/or programming languages such as, for example, Hyper text Markup Language (HTML), Dynamic HTML, Extensible Markup Language (XML), Extensible Stylesheet Language (XSL), Document Style Semantics and Specification Language (DSSSL), Cascading Style Sheets (CSS), Synchronized Multimedia Integration Language (SMIL), Wireless Markup Language (WML), Java.™., Jini.™., C, C++, Smalltalk, Perl, UNIX Shell, Visual Basic or Visual Basic Script, Virtual Reality Markup Language (VRML), ColdFusion.™. or other compilers, assemblers, interpreters or other computer languages or platforms.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

A network is a collection of links and nodes (e.g., multiple computers and/or other devices connected together) arranged so that information may be passed from one part of the network to another over multiple links and through various nodes. Examples of networks include the Internet, the public switched telephone network, the global Telex network, computer networks (e.g., an intranet, an extranet, a local-area network, or a wide-area network), wired networks, and wireless networks.

The Internet is a worldwide network of computers and computer networks arranged to allow the easy and robust exchange of information between computer users. Hundreds of millions of people around the world have access to computers connected to the Internet via Internet Service Providers (ISPs). Content providers (e.g., website owners or operators) place multimedia information (e.g., text, graphics, audio, video, animation, and other forms of data) at specific locations on the Internet referred to as webpages. Websites comprise a collection of connected, or otherwise related, webpages. The combination of all the websites and their corresponding webpages on the Internet is generally known as the World Wide Web (WWW) or simply the Web.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

It will be readily apparent that the various methods and algorithms described herein may be implemented by, e.g., appropriately programmed general purpose computers and computing devices. Typically a processor (e.g., a microprocessor) will receive instructions from a memory or like device, and execute those instructions, thereby performing a process defined by those instructions. Further, programs that implement such methods and algorithms may be stored and transmitted using a variety of known media.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article. The functionality and/or the features of a device may be alternatively embodied by one or more other devices which are not explicitly described as having such functionality/features. Thus, other embodiments of the present invention need not include the device itself.

The term "computer-readable medium" as used herein refers to any medium that participates in providing data (e.g., instructions) which may be read by a computer, a processor or a like device. Such a medium may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, removable media, flash memory, a "memory stick", any other memory chip or cartridge, a carrier wave as described hereinafter, or any other medium from which a computer can read.

Various forms of computer readable media may be involved in carrying sequences of instructions to a processor. For example, sequences of instruction (i) may be delivered from RAM to a processor, (ii) may be carried over a wireless transmission medium, and/or (iii) may be formatted according to numerous formats, standards or protocols, such as Bluetooth, TDMA, CDMA, 3G.

Where databases are described, it will be understood by one of ordinary skill in the art that (i) alternative database structures to those described may be readily employed, (ii) other memory structures besides databases may be readily employed. Any schematic illustrations and accompanying descriptions of any sample databases presented herein are exemplary arrangements for stored representations of information. Any number of other arrangements may be employed besides those suggested by the tables shown. Similarly, any illustrated entries of the databases represent exemplary information only; those skilled in the art will understand that the number and content of the entries can be different from those illustrated herein. Further, despite any depiction of the databases as tables, an object-based model could be used to store and manipulate the data types of the present invention and likewise, object methods or behaviors can be used to implement the processes of the present invention.

A "computer system" may refer to a system having one or more computers, where each computer may include a computer-readable medium embodying software to operate the computer or one or more of its components. Examples of a computer system may include: a distributed computer system for processing information via computer systems linked by a network; two or more computer systems connected together via a network for transmitting and/or receiving information between the computer systems; a computer system including two or more processors within a single computer; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an internet, such as the Internet; an intranet; a local area network (LAN); a wide area network (WAN); and a combination of networks, such as an internet and an intranet.

As used herein, the "client-side" application should be broadly construed to refer to an application, a page associated with that application, or some other resource or function invoked by a client-side request to the application. A "browser" as used herein is not intended to refer to any specific browser (e.g., Internet Explorer, Safari, FireFox, or the like), but should be broadly construed to refer to any client-side rendering engine that can access and display Internet-accessible resources. A "rich" client typically refers to a non-HTTP based client-side application, such as an SSH or CFIS client. Further, while typically the client-server interactions occur using HTTP, this is not a limitation either. The client server interaction may be formatted to conform to the Simple Object Access Protocol (SOAP) and travel over HTTP (over the public Internet), FTP, or any other reliable transport mechanism (such as IBM.®. MQSeries.®. technologies and CORBA, for transport over an enterprise intranet) may be used. Any application or functionality described herein may be implemented as native code, by providing hooks into another application, by facilitating use of the mechanism as a plug-in, by linking to the mechanism, and the like.

Exemplary networks may operate with any of a number of protocols, such as Internet protocol (IP), asynchronous transfer mode (ATM), and/or synchronous optical network (SONET), user datagram protocol (UDP), IEEE 802.x, etc.

Embodiments of the present invention may include apparatuses for performing the operations disclosed herein. An apparatus may be specially constructed for the desired purposes, or it may comprise a general-purpose device selectively activated or reconfigured by a program stored in the device.

Embodiments of the invention may also be implemented in one or a combination of hardware, firmware, and software. They may be implemented as instructions stored on a machine-readable medium, which may be read and executed by a computing platform to perform the operations described herein.

More specifically, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In the following description and claims, the terms "computer program medium" and "computer readable medium" may be used to generally refer to media such as, but not limited to, removable storage drives, a hard disk installed in hard disk drive, and the like. These computer program products may provide software to a computer system. Embodiments of the invention may be directed to such computer program products.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Additionally, the phrase "configured to" or "operable for" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments within the scope of the present disclosure may also include tangible and/or non-transitory computer-readable storage media for carrying or having computer-executable instructions or data structures stored thereon. Such non-transitory computer-readable storage media can be any available media that can be accessed by a general purpose or special purpose computer, including the functional design of any special purpose processor as discussed above. By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

While a non-transitory computer readable medium includes, but is not limited to, a hard drive, compact disc, flash memory, volatile memory, random access memory, magnetic memory, optical memory, semiconductor based memory, phase change memory, optical memory, periodically refreshed memory, and the like; the non-transitory computer readable medium, however, does not include a pure transitory signal per se; i.e., where the medium itself is transitory.

Many embodiments of the present invention, and variations thereof, provide an easy format to save a sparse matrix and to remove redundant computing operations. Many embodiments may use a bit mask and a location to indicate a value where it is zero or not. Some embodiments may use this format to indicate where a calculation is not needed such as, but not limited to, Value A*zero or Value A+zero. In some embodiments, a pyramid format may be used to further save storage if the matrix is very sparse. Some embodiments separate the mask and value. In some embodiments, the mask may be loaded and an operation performed to decide which data is useful for the following operations. Some embodiments may save the bandwidth of data loading.

In many embodiment a mask bit may be used to represent zero and non-zero values of, but not limited to, array, matrix or tensors. The nonzero value of "array", "matrix" or "tensor" are in a packed format and use the mask to indicate the zero and non-zero locations. Storage area and/or computing operations are reduced. In some embodiments, a hierarchical pyramid level of bit masks may be used to further reduce and packed non-zero mask when the upper level bit mask is non-zero. Some embodiments separate the mask and values in different formats and surfaces. Some embodiments apply the concept to dropout architecture. In some embodiments, at least one of the buffers/caches or fifos contains the packed format. In some embodiments, two separated surfaces may be used to represent the sparse format. One may be used for mask surface and the other for packed value surface. In some embodiments, three separated surfaces may be used to represent the sparse format. One may be used for mask surface, another for block length surface and the other for packed value surface. In some embodiments, operations may be skipped based on the value of the mask. In some embodiments, operations may be skipped based on the operation of two set of masks.

FIGS. 1a, 1b and 1c illustrate an exemplary CSR format. The CSR format puts the subsequent non-zeros of the matrix rows in contiguous memory locations. Assuming a non-symmetric sparse matrix A 105, 3 vectors may be created, one for floating-point numbers (val) 110, and the other two for integers col_ind 115, and row_ptr 120. A val vector 110 stores the values of the nonzero elements of the matrix A 105, as they are traversed in a row-wise fashion. A col_ind vector 115 stores the column indexes of the elements in the val vector. That is, if val(k)=$a_{i,j}$ then col_d(k)=j. A row_ptr vector 120 stores the locations in the val vector that start a row, that is, if val(k)=$a_{i,j}$ then row_ptr(i)≤k<row_(i+1). Convention defines row_ptr(n+1)=nnz+1, where nnz is the number of non-zeros in the matrix A. A storage savings for this approach may be significant. Instead of storing $n^2$ elements, only 2nnz+1 storage locations are needed.

FIGS. 2a, 2b and 2c illustrate an exemplary compression format, in accordance with an embodiment of the present invention. In the present embodiment, exemplary matrix A 205 may be non-symmetrical. A val vector 210 may store the values of the nonzero elements of the matrix A 205, as they are traversed in a row-wise fashion. In other embodiments, val vector 210 may store the values of the nonzero elements of the matrix A 205, as they are traversed in a column-wise fashion. Mask of A 225 may store a bit mask where locations indicate if the value in matrix A 205 is zero or not. In the present embodiment, a bit may be assigned a 1 if the corresponding value in matrix A 205 is non-zero and a 0 if the value is 0. In other embodiments, a bit may be assigned a 0 if the corresponding value in matrix A 205 is non-zero and a 1 if the value is 0.

FIG. 3 illustrates an exemplary method for compression, in accordance with an embodiment of the present invention. In the present embodiment, a process 300 starts where elements of matrix 205 may be examined in a step 302. In a step 306 it may be determined if the examined element is non-zero. If the value is non-zero, then in a step 310 the value of the element may be stored in vector 210 and in a step 314, a corresponding bit of mask 225 may be assigned a value of 1. The process may then return to step 302. If the value of the element is zero, the corresponding bit of mask 225 may be assigned a value of 0. The process may then return to step 302. In other embodiments, the values of the mask bits may be reversed where, without limitation, a 1 corresponds to a zero element and a 0 corresponds to a non-zero element.

Figure 4C:
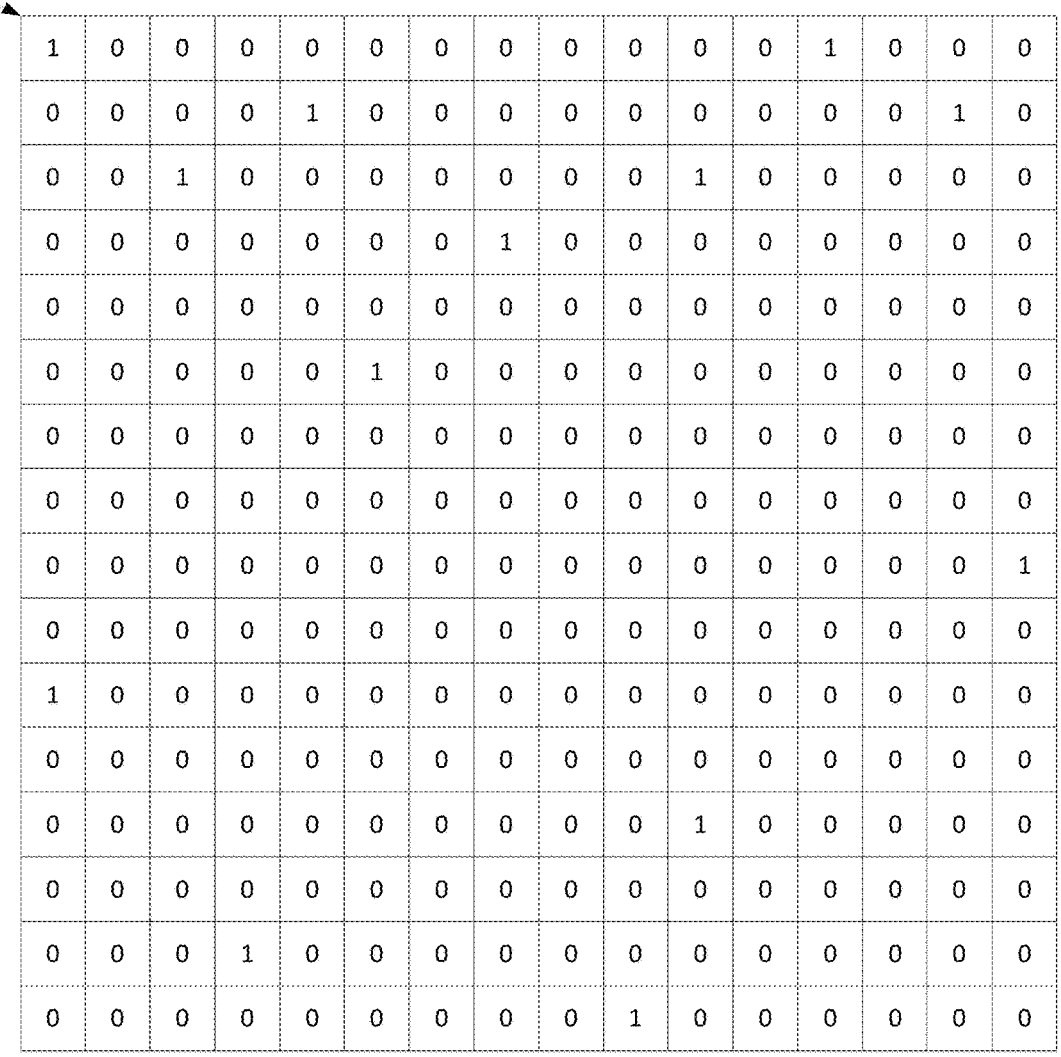

FIGS. 4a, 4b and 4c illustrate an exemplary compression format, in accordance with an embodiment of the present invention. In the present embodiment, exemplary matrix B 405 may be a non-symmetrical sparse matrix. A val vector 410 may store the values of the non-zero elements of the matrix A 405, as they are traversed in a row-wise fashion. In other embodiments, val vector 410 may store the values of the non-zero elements of the matrix A 405, as they are traversed in a column-wise fashion. Mask of B 425 may store a bit mask where locations indicate if the value in matrix B 405 is zero or not. In the present embodiment, a bit may be assigned a 1 if the corresponding value in matrix B 405 is non-zero and a 0 if the value is 0. In other embodiments, the values of the mask bits may be reversed where, without limitation, a 1 corresponds to a zero element and a 0 corresponds to a non-zero element. In the present embodiment, one level of mask map may be employed. When the sparsity of the matrix is high, the masks map may be reduced to two level of mask maps. In some embodiments, the use of multiple levels of mask maps may depend on, without limitation, a capacity, granularity and efficiency of fetching and storing, such as, without limitation, a read/write capacity and efficiency of DRAM, NAND or Optane (3D Xpoint). In a non-limiting example, if many small granularity of 16B are read from a DRAM, the efficiency may be different from reading the same bytes for 64B. For 16B, the read efficiency might be 30-40%. When reading 64B, the efficiency may be around 95%. These number may vary depending on the type of DRAM in use. If the matrix is very big hierarchy mask maps, also referred to as pyramid mask maps, may be used.

Figure 5A:
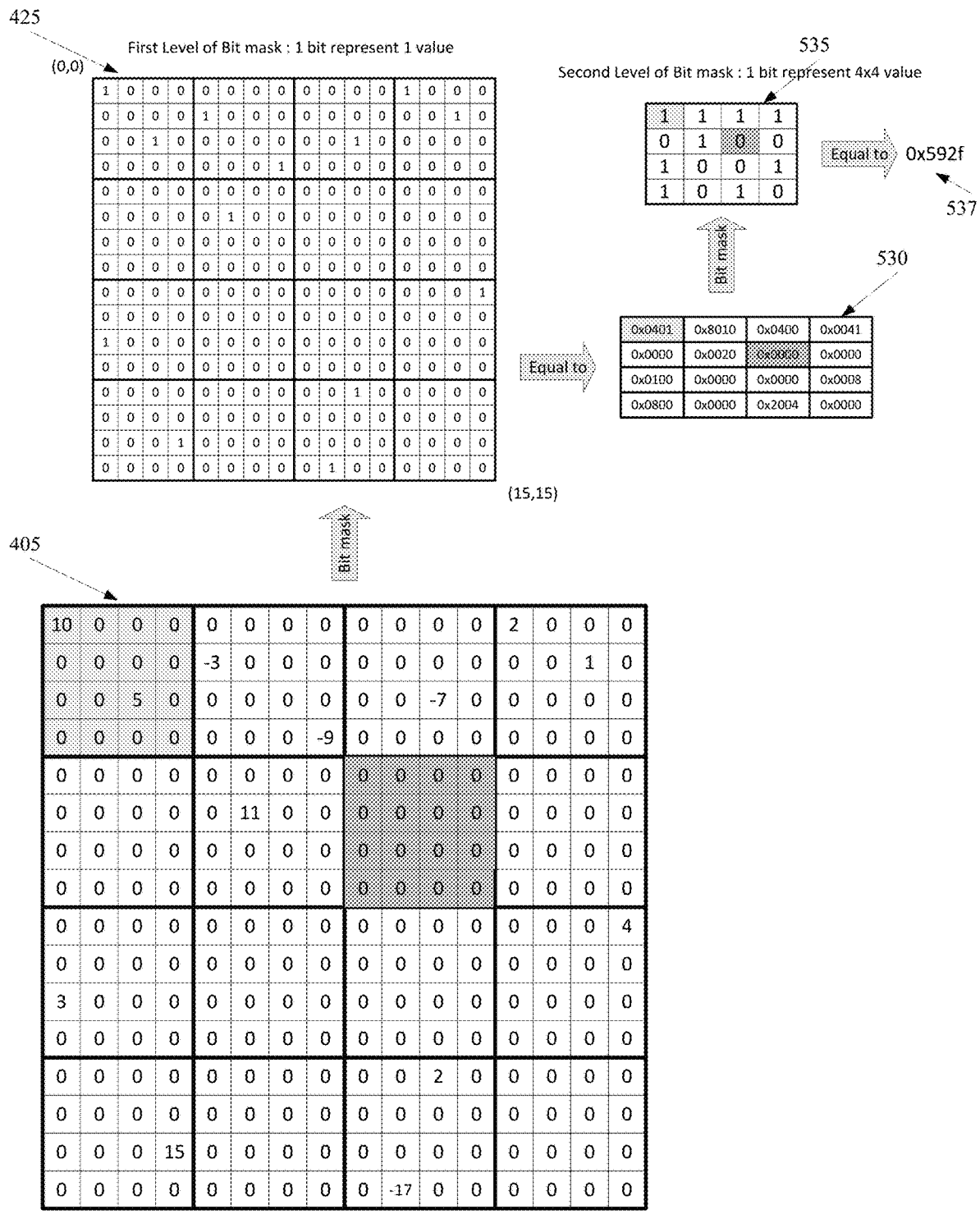
FIGS. 5a and 5b illustrate an exemplary two-level pyramid mask compression format, in accordance with an embodiment of the present invention.
Figure 5B:
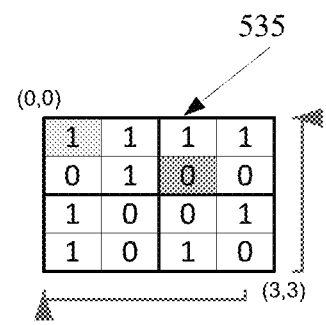

FIGS. 5*a* and 5*b* illustrate an exemplary two-level pyramid mask compression format, in accordance with an embodiment of the present invention. In the present embodiment, exemplary matrix B 405 may be a non-symmetrical sparse matrix. A val vector 410 may store the values of the non-zero elements of the matrix A 405, as they are traversed in a row-wise fashion. Mask of B 425 may store a bit mask where locations indicate if the value in matrix B 405 is zero or not. In the present embodiment, a bit may be assigned a 1 if the corresponding value in matrix B 405 is non-zero and a 0 if the value is 0. In other embodiments, the values of the mask bits may be reversed where, without limitation, a 1 corresponds to a zero element and a 0 corresponds to a non-zero element. The present embodiment shows the two-level pyramid. The first level mask 425 may use one bit to represent zero or non-zero. The second level mask 535 may use one bit to represent 4×4 values. Matrix 530 may store the packed values of the 4×4 tiles of first level mask 425. The packed values may be determined as shown in FIG. 5*b* and represented in HEX. The second level mask 535 may be a bit map of matrix 530. A packed value 537 of mask 535 may be determined as shown in FIG. 5*b*. In other embodiments, packing may be done within a chuck or tile. Masks may be represented in a header and packed data in data fields. Additionally, the length of packed data may be specified in a field in the header.

Figure 6:
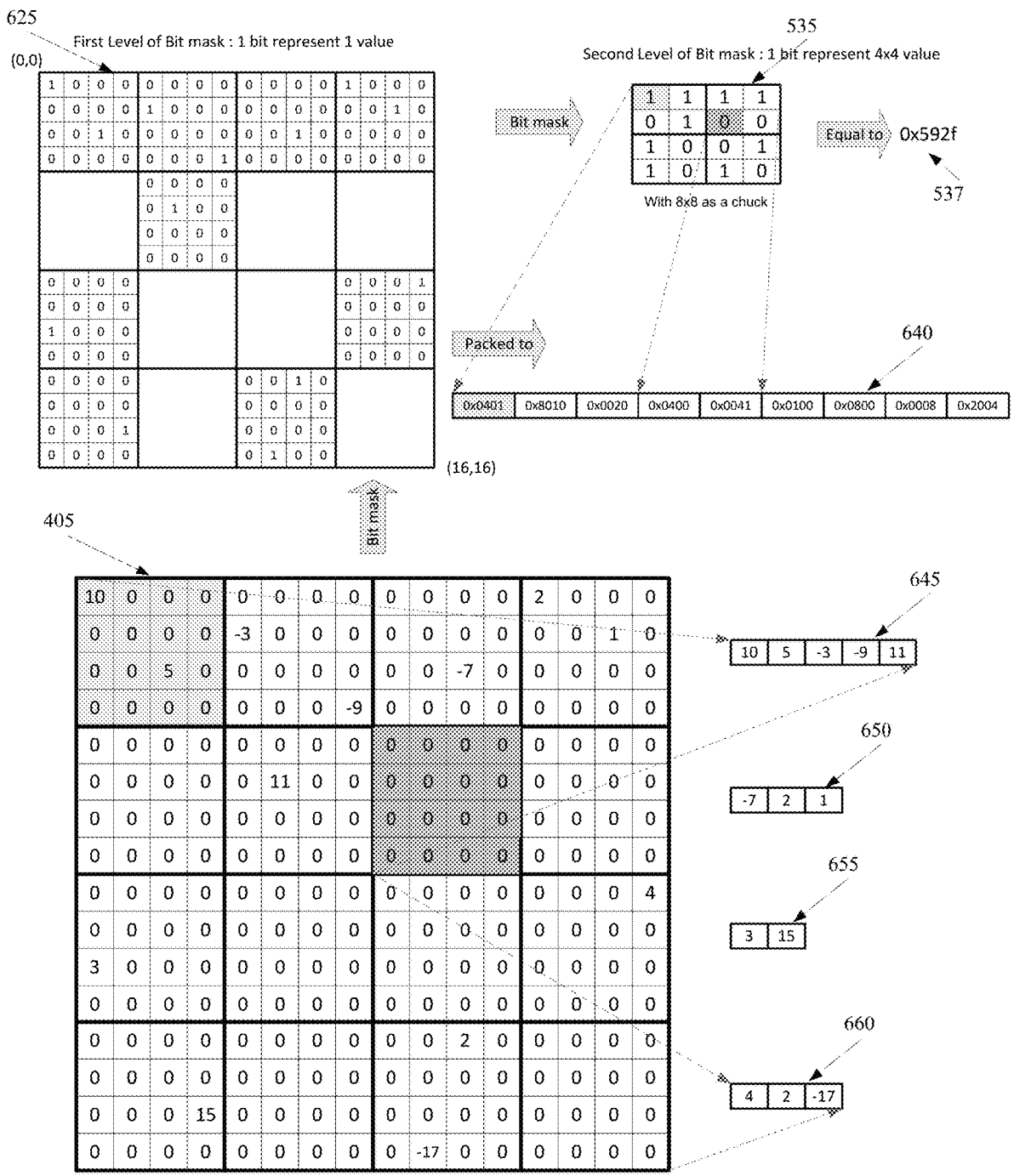
FIG. 6 illustrates an exemplary two-level pyramid mask compression format, in accordance with an embodiment of the present invention.
Figure 7A:
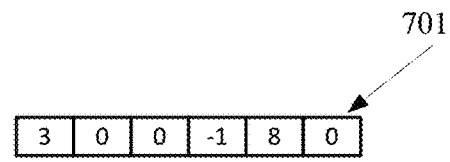
FIGS. 7a-7d illustrate an exemplary convolution operation, in accordance with an embodiment of the present invention.
Figure 7B:
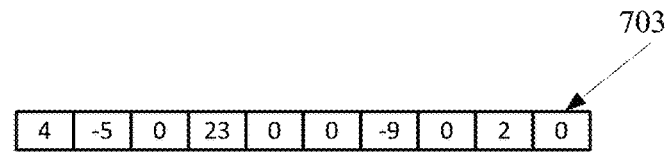
Figure 7C:
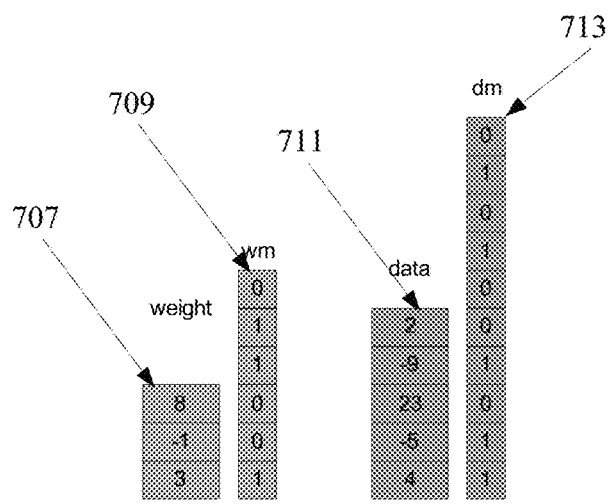
Figure 7D:
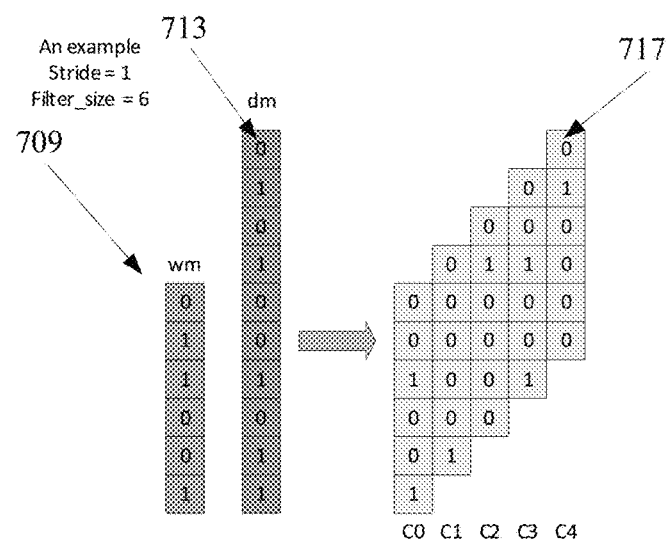

FIG. 6 illustrates an exemplary two-level pyramid mask compression format, in accordance with an embodiment of the present invention. In the present embodiment, exemplary matrix B 405 may be a non-symmetrical sparse matrix. The first level mask 625 may use one bit to represent zero or non-zero of matrix 405. In the present embodiment, the 4×4 tiles in mask 625 that equate to zero may be removed or ignored. A vector 640 may store the packed values of the remaining tiles with a 8×8 chuck. In the present embodiment, the chuck is an area of a tile of 8×8 pixels. In the present embodiment, the second level mask 535 may be a bit mask of mask 625 and packs 0x592f 537. The packed data in the matrix 405 may be Val_B_00 (first 8×8) 645, Val_B_01 (second 8×8) 650, Val_B_10 (third 8×8) 655, and Val_B_11 (fourth 8×8) 660.

In a non-limiting example, if one stores matrix 405 with the size of 16×16 and 4 bytes for each value, the needed storage size may be 16×16×4 bytes=1024 bytes. In the present embodiment, the storage for the pyramid packed format may be:

First level packed masks 640: 9×2 bytes=18 bytes
Second level packed mask 537: 1×2 bytes=2 bytes
Packed values 645, 650, 655, and 660: 13×4 bytes=52 bytes
Total bytes: 18 bytes+2 bytes+52 bytes=72 bytes.

In a non-limiting example, if one multiplies Matrix B 405 multiple with a vector A with all non-zero values of 16×1 size, a typical computation operation may be:

Multiply operation: 16×16=256 operations; and
Adder operation: 16×15=240 operations.

Using the mask format of the present embodiment, the computations may be reduced to:

Multiply operation: 13 non-zeros=13 operations; and
Adder operation: 3 operations.

FIGS. 7*a*-7*d* illustrate an exemplary convolution operation, in accordance with an embodiment of the present invention. In the present embodiment, a filter matrix 701 may have a filter size of 1×6. A data matrix 703 may have size of 1×10.

In a typical conventional convolution operation, to obtain a result matrix C with a size of 1×5:

C0=3×4+0×(−5)+0×0+(−1)×23+8×0+0×0;

C1=3×(−5)+0×0+0×23+(−1)×0+8×0+0×(−9);

C2=3×0+0×23+0×0+(−1)×0+8×(−9)+0×0;

C3=3×23+0×0+0×0+(−1)×(−9)+8×0+0×2; and

C4=3×0+0×0+0×(−9)+(−1)×0+8×2+0×0.

The total operations performed may be 6×5 multiply operations and 5×5 adder operations.

In an embodiment of the present invention, filter matrix 701 may have 3 packed weights 707 and a 6 weight mask 709. Data matrix 703 may have 5 packed data 711 and a 10 data mask 713. For the convolution operations, only a one dimensional convolution may be used. In other embodiments, it may be extended to 2 dimensions, 3 dimensions or N dimensions. The weight mask 709 "AND" with the data mask 713 result may be shown on column C0 of 717. Then the filter is moved one step up, it is because the stride is set to 1 in this example, then another set of mask result may be generated in a C1 column. Continuing moving of the filter may generate a C2 column, C3 column and C4 column.

The final result of matrix C:

C0=3×4+(−1)×23;

C1=3×(−5);

C2=8×(−9);

C3=3×23+(−1)×(−9); and

C4=8×2;

By using the present method, the calculations may be reduced to 1 multiplier operation in C1, C2 and C4 or 2 multiplier operations in C0 and C3; and 0 adder operation in C1, C2 and C4 or 1 adder operations in C0 and C3.

In the present embodiment, the mask operation may be performed and the non-zero after bit mask operation may be known. Then the data of the final non-zero is fetched for future operations like multiplier or adder operation. In the present embodiment, the operations and bandwidth may be reduced.

Figure 8:
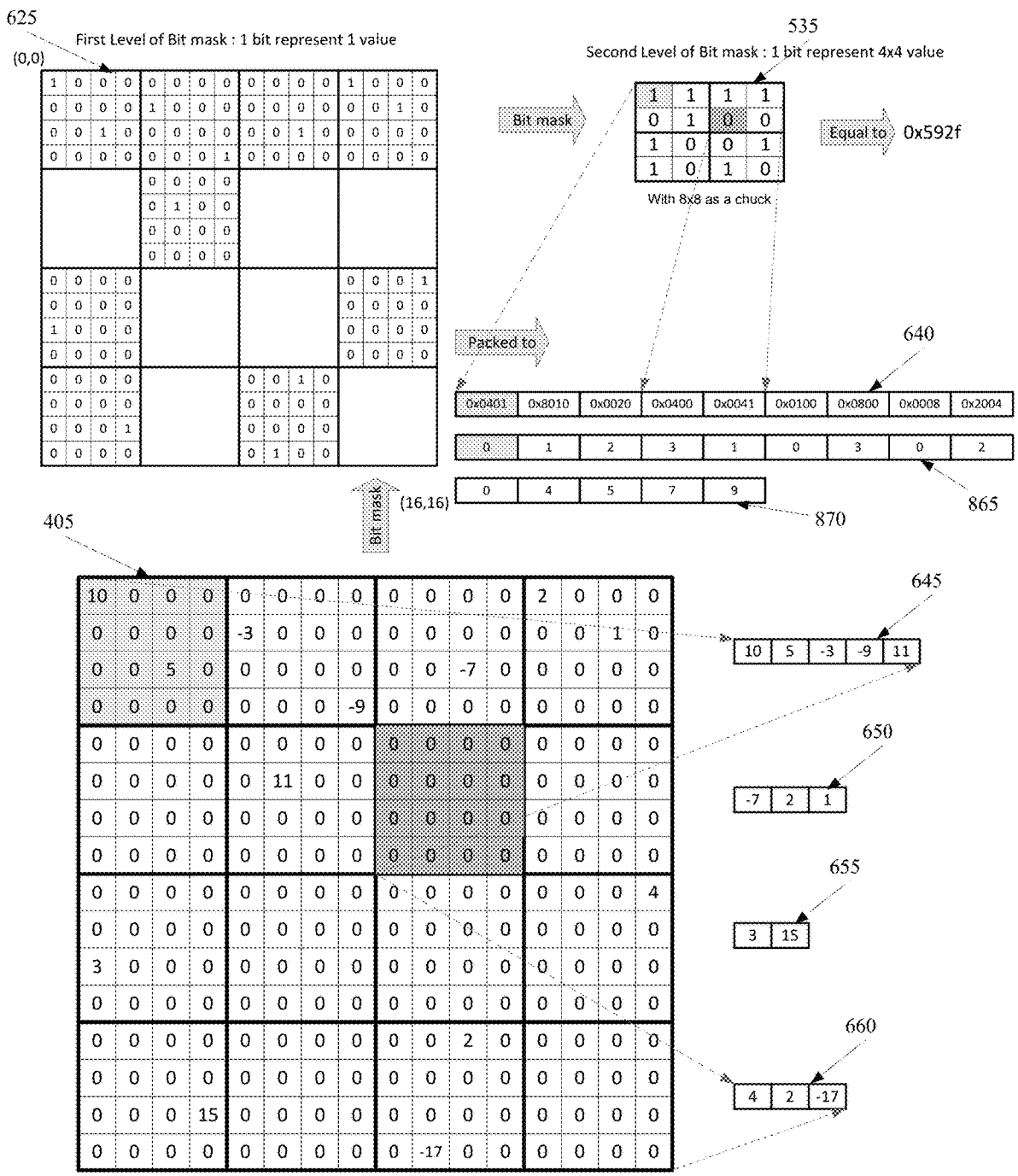
FIG. 8 illustrates an exemplary hybrid two-level pyramid mask compression format, in accordance with an embodiment of the present invention.

FIG. 8 illustrates an exemplary hybrid two-level pyramid mask compression format, in accordance with an embodiment of the present invention. In the present embodiment, exemplary matrix B 405 may be a non-symmetrical sparser matrix. The first level mask 625 may use one bit to represent zero or non-zero of matrix 405. In the present embodiment, the 4×4 tiles in mask 625 that equate to zero may be removed or ignored. A vector 640 may store the packed values of the remaining tiles with a 8×8 chuck. In the present embodiment, the second level mask 535 may be a bit mask of mask 625 and packs 0×592 f 537. The packed data in the matrix 405 may be Val_B_00 (first 8×8) 645, Val_B_01 (second 8×8) 650, Val_B_10 (third 8×8) 655, and Val_B_11 (fourth 8×8) 660. Vectors 865 and 870 may be derived using a CSR format. In some embodiments, CSR or other sparse formats including, but not limited to, CSC, ELL, COO, BSR, DIA, DOK, LIL, SKY, etc. may be used and converted into the bit mask operation at the time an operation is needed. In the present embodiment a 4×4 may be used as a tile for mask packing. In other embodiments any size may be used such as, but not limited to, 4×1, 1×4, 4×2, 2×4 or 8×8 as a tile for mask packing to represent the hierarchy pyramid mask levels. In some embodiments, a first level mask in bit mask may be used and the second level mask may use CSR format.

Figure 9:
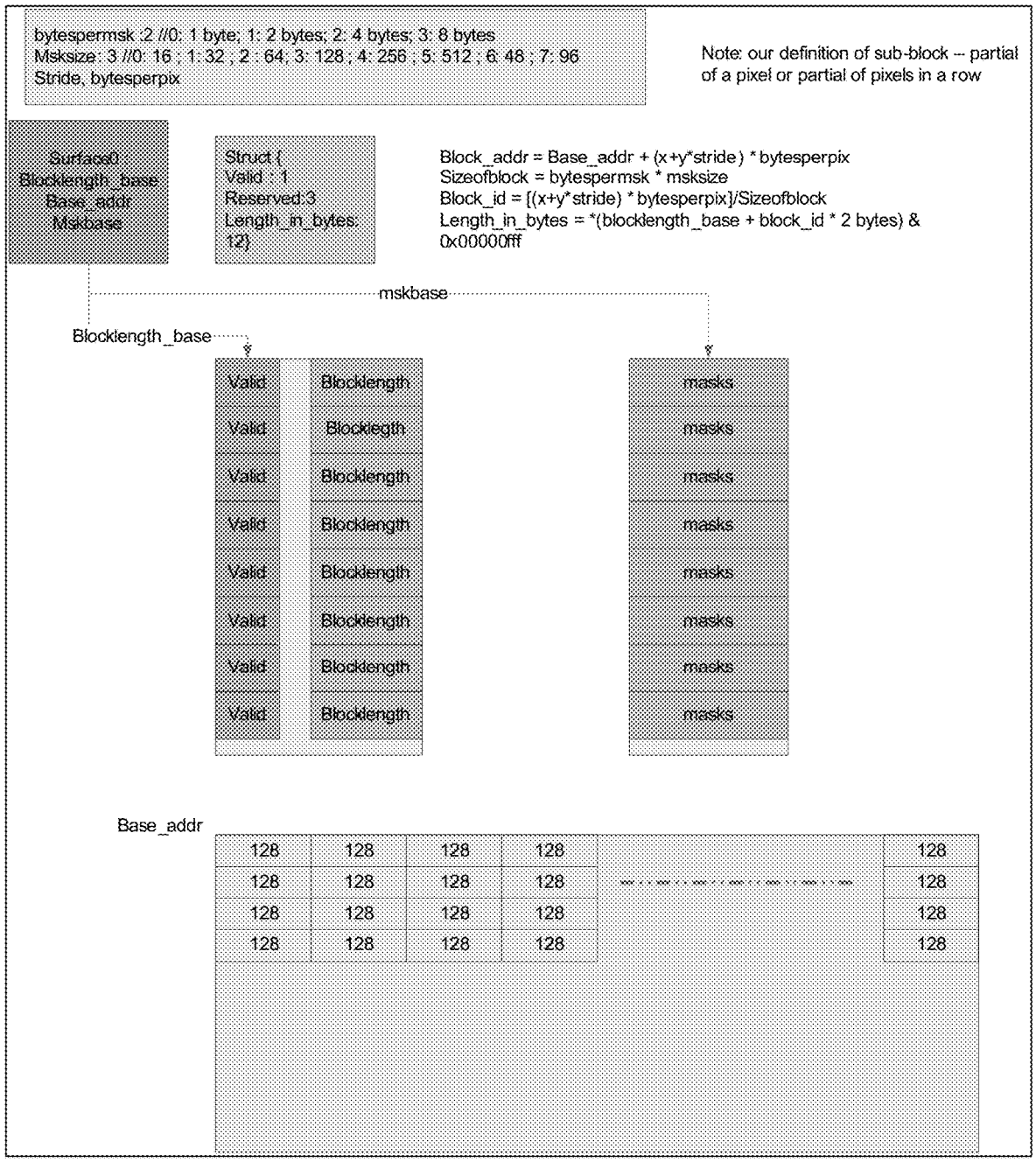
FIG. 9 illustrates an exemplary program structure, in accordance with an embodiment of the present invention.

FIG. 9 illustrates an exemplary program structure, in accordance with an embodiment of the present invention. The present embodiment separates the mask bits with associated matrix compressed values in the different surfaces. Surface may be a description of the format of a tile or a frame. One format may be for mask and the other format for value. In a non-limiting example, the mask may be 1-bit format or 2-bits or other format. The value may be 1-bit, 2-bits . . . 8 bits, 16 bits, 32 bits or more. The present embodiment only shows the first level masks associated with the compressed values. The Blocklength may indicate the variable length of compressed values. The present embodiment may have three base addresses: One is the BlockLength base address, another is mask base address and the other is value base address. Blocklength remember the variable length of each block, and mask remember the mask of each block. The value remember the packed value of each block. The bytes per mask may represent the format of n bytes per mask associated with. Mask size per block may indicate how many mask bits in each block. The present embodiment may program how big is per block. The block may be for example, but not limited to, be one-dimensional array, two-dimensional array or a tensor.

Figure 10:
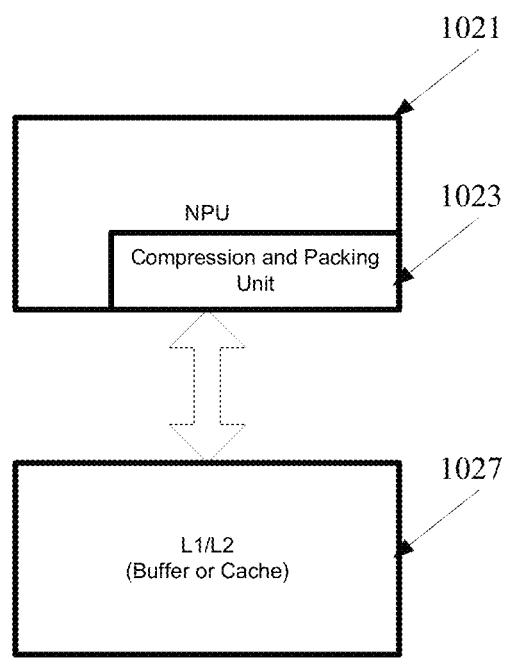
FIG. 10 illustrates an exemplary processor structure, in accordance with an embodiment of the present invention.

FIG. 10 illustrates an exemplary processor structure, in accordance with an embodiment of the present invention. The present embodiment includes a NPU 1021, a compression and packing unit 1023, and a L1/L2 buffer or cache 1027. The present embodiment illustrates that NPU 1021 may compress feature maps through training and prediction process and weights data through training process. The data may store in L1/L2 Cache or Buffer 1027. The features map and weight data may store in the same buffer or different buffer.

Figure 11:
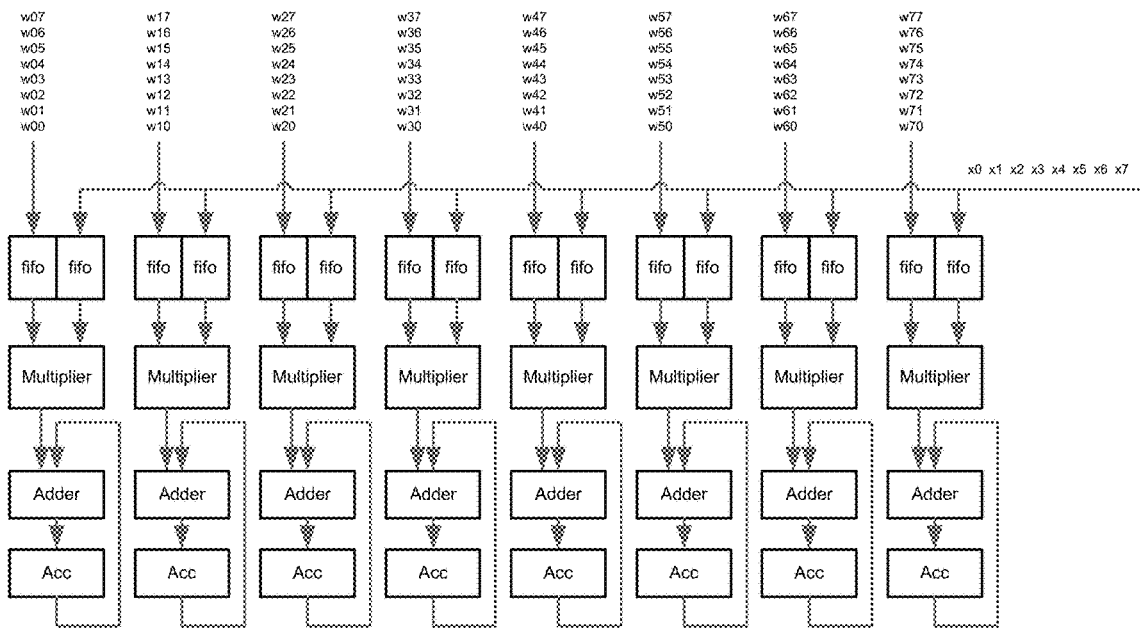
FIG. 11 illustrates a standard multiplication process.

FIG. 11 illustrates a standard multiplication process. FIG. 11 illustrates the multiplication of matrix W (weight) and vector X in the standard procedure. The weight of different rows goes into the different fifos and the vectors share and broadcast into different fifos. Then the weights W and vectors X will enter into different multiply and adders and accumulate until the weights of the eights row of matrix W multiplies with the whole column of vectors and accumulate into individual accumulators.

Figure 12:
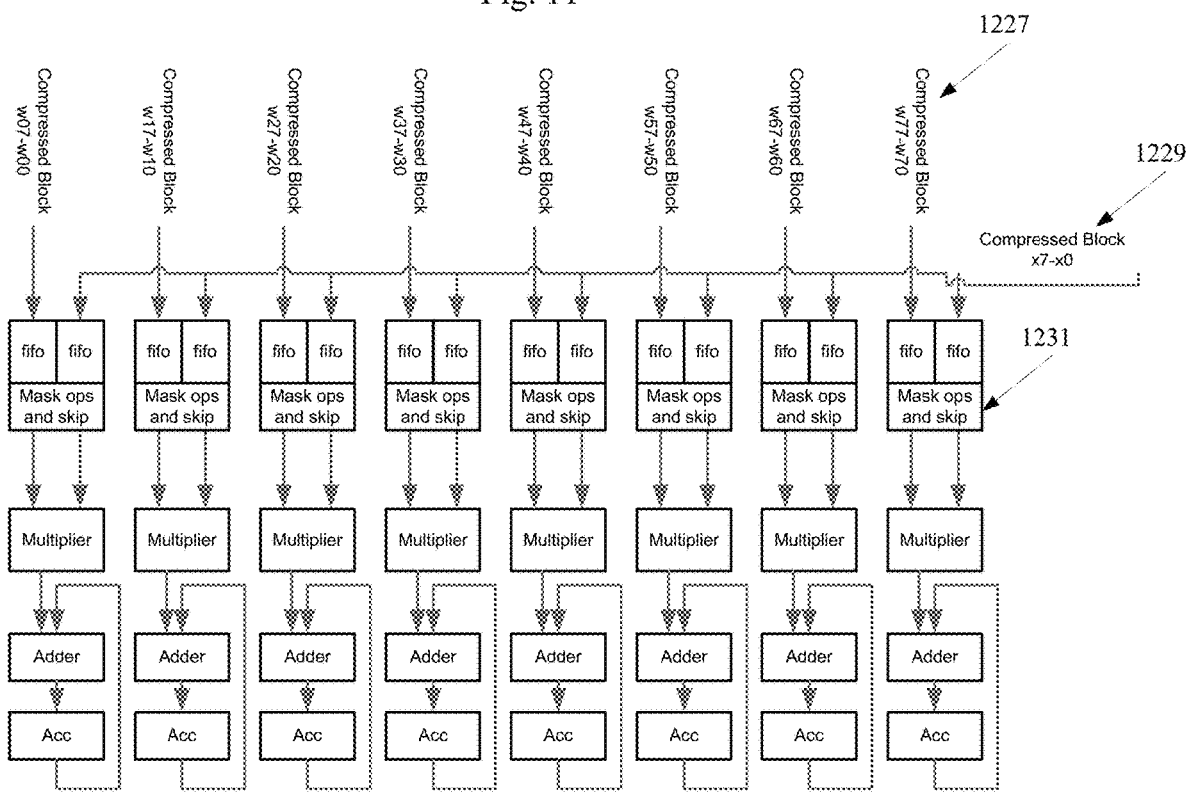
FIG. 12 illustrates a multiplication process, in accordance with an embodiment of the present invention.

FIG. 12 illustrates a multiplication process, in accordance with an embodiment of the present invention. The present embodiment may apply the compressed format and improve the architecture. FIG. 12 illustrates the whole row of weights replaced by a compressed block 1227 and the vector compressed to another block 1229. The present embodiment mask ops (operations) 1231 may help and skip the real operations, as described herein.

Figure 13:
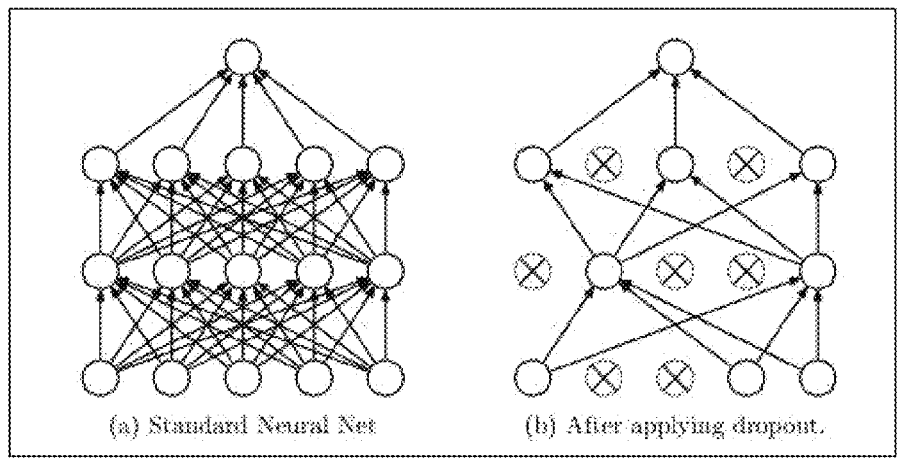
FIG. 13 illustrates a neural net, in accordance with an embodiment of the present invention.

FIG. 13 illustrates a neural net, in accordance with an embodiment of the present invention. In the present embodiment the input layer is at the bottom node of the network—a vector, the connections to the 1st hidden layer may be the weight matrix. A weight matrix multiplication with a vector (input layer), results in a 1st hidden layer. As, shown in figure (b), operations may be reduced to just a few connections left. Furthermore, when the 1st hidden layer is reduced in dropout, the destination may be pre-packed with a packed format before doing the operations. The operations of going to the destination nodes of the 1st hidden layer may be skipped which nodes are going to dropout. Then the method may be applied to the 2nd hidden layer and then to the output layer.

Figure 14:
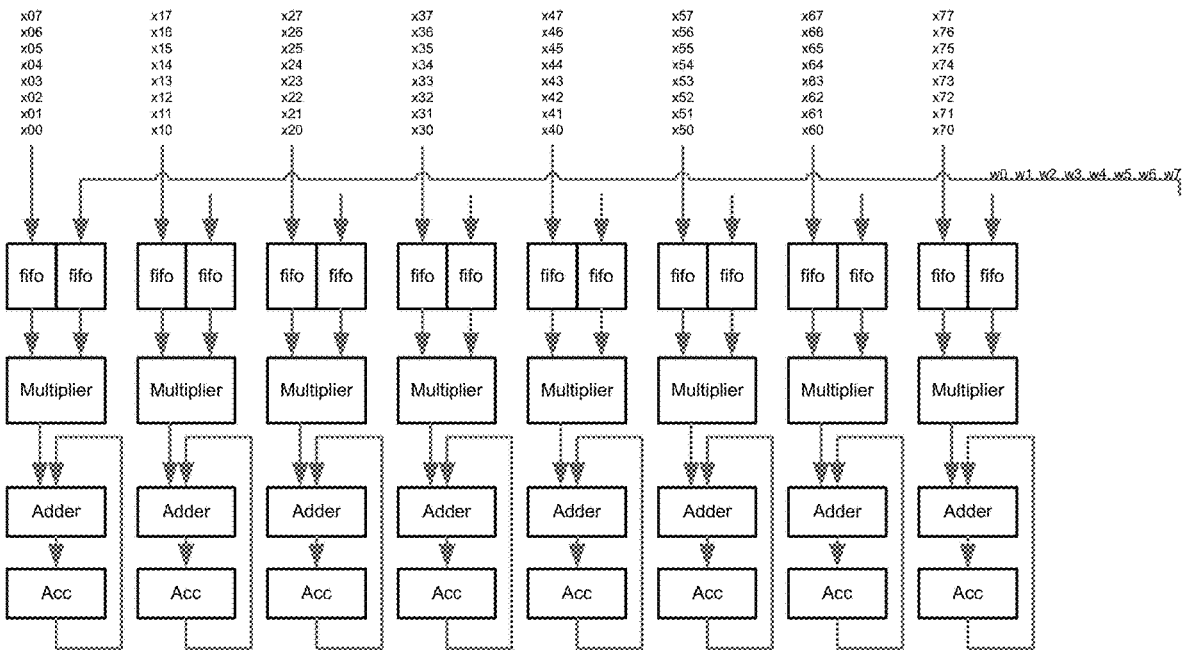
FIG. 14 illustrates a multiplication process.

FIG. 14 illustrates a multiplication process.

Figure 15:
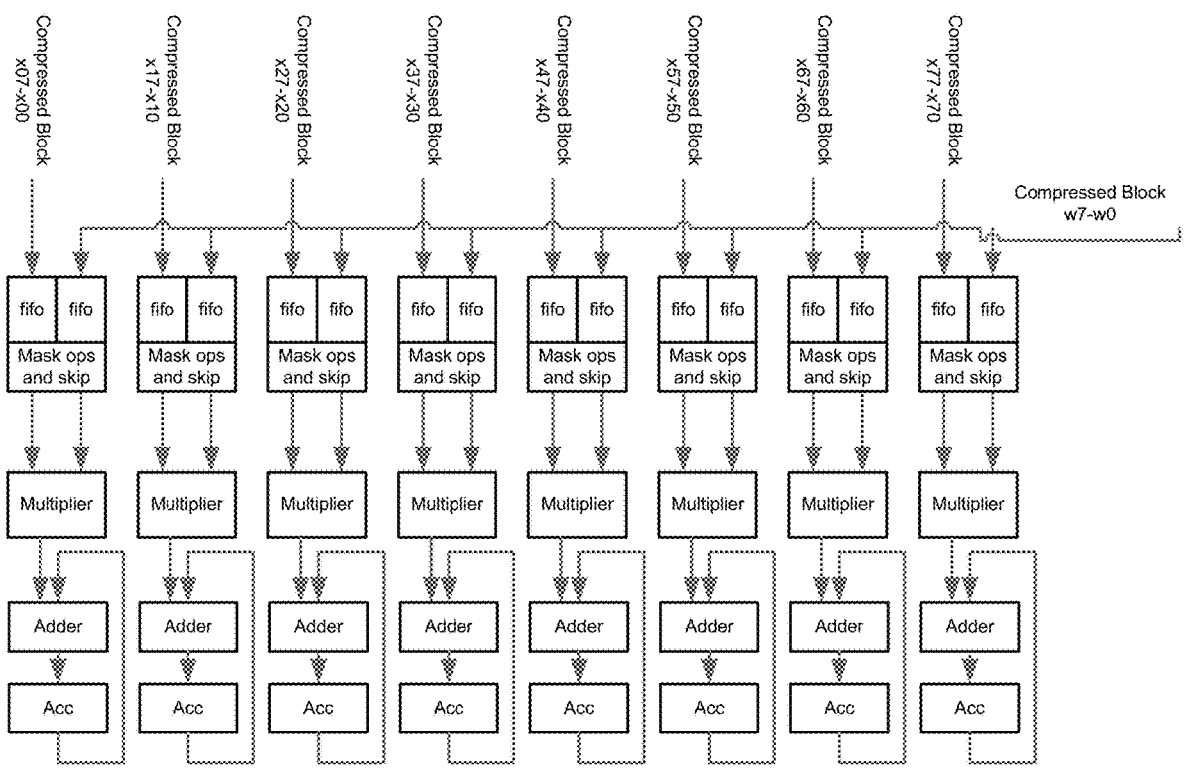
FIG. 15 illustrates a multiplication process, in accordance with an embodiment of the present invention.

FIG. 15 illustrates a multiplication process, in accordance with an embodiment of the present invention. The present embodiment illustrates a matrix X multiply with a vector W. In other embodiments, it may be an image data x convolutes with weights. The weight may be one dimensional filters or two-dimensional filters or n-dimensional filters convolution with image data or other data.

Figure 16:
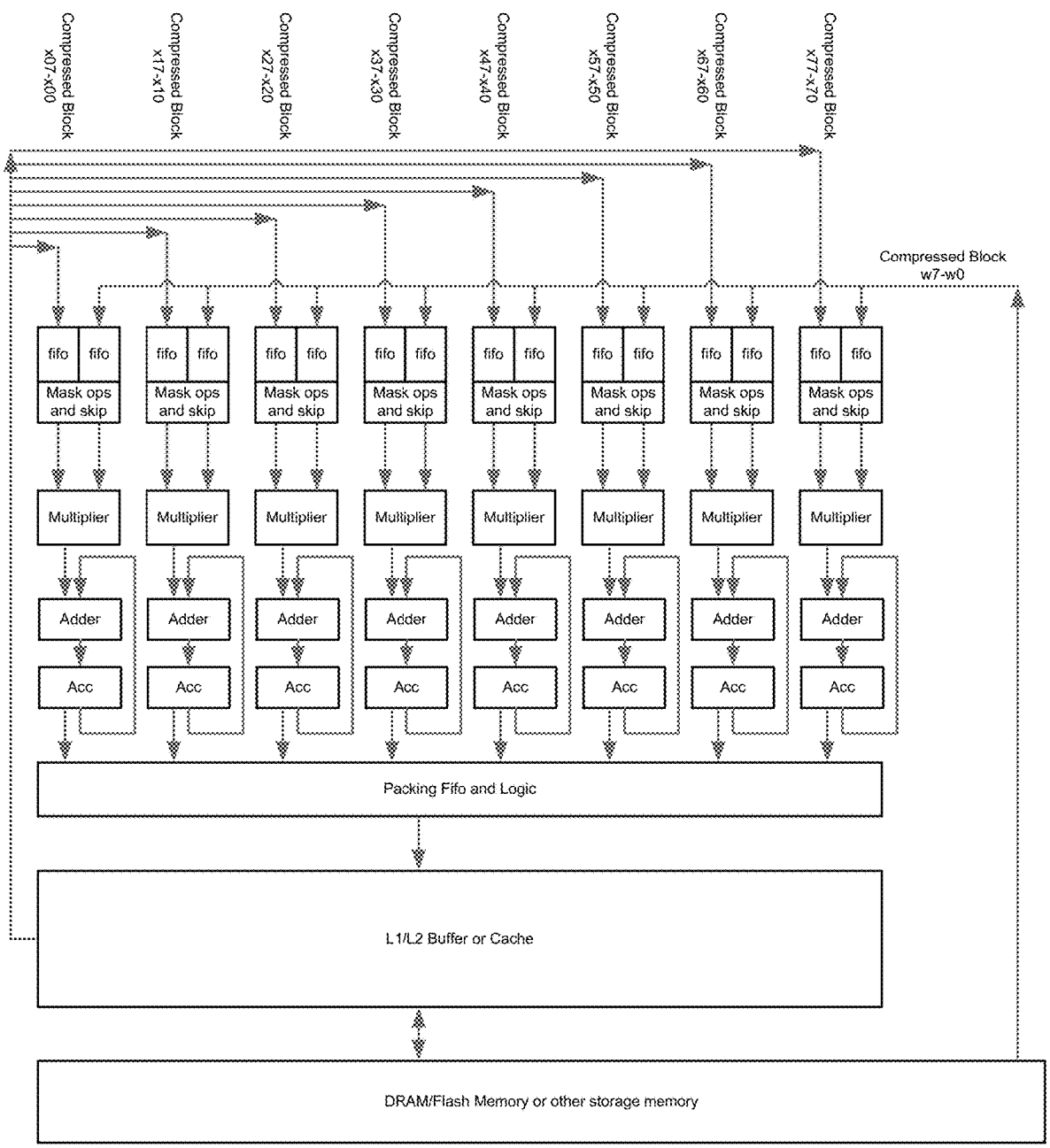
FIGS. 16-18 illustrate architectures, in accordance with an embodiments of the present invention.
Figure 17:
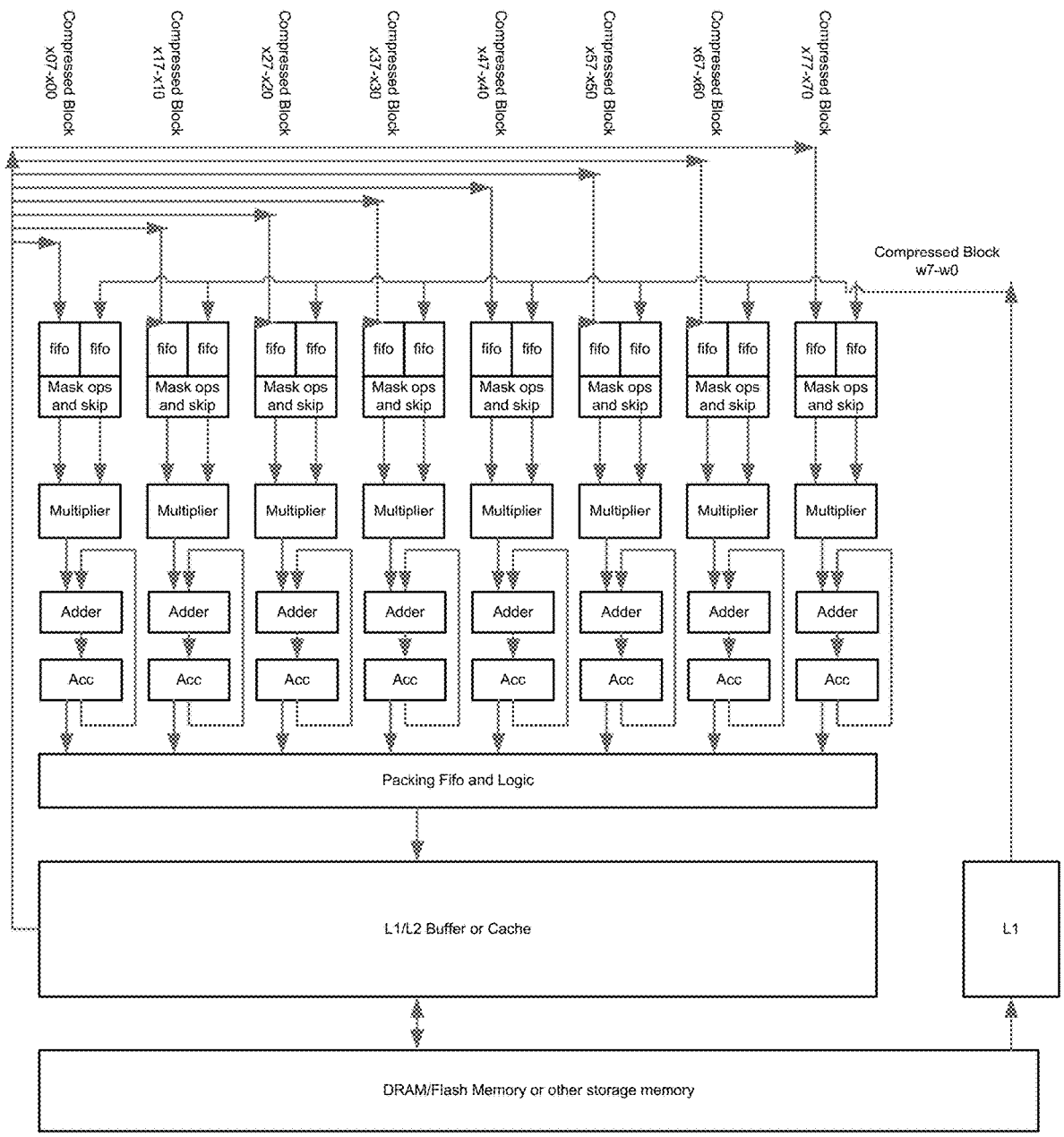
Figure 18:
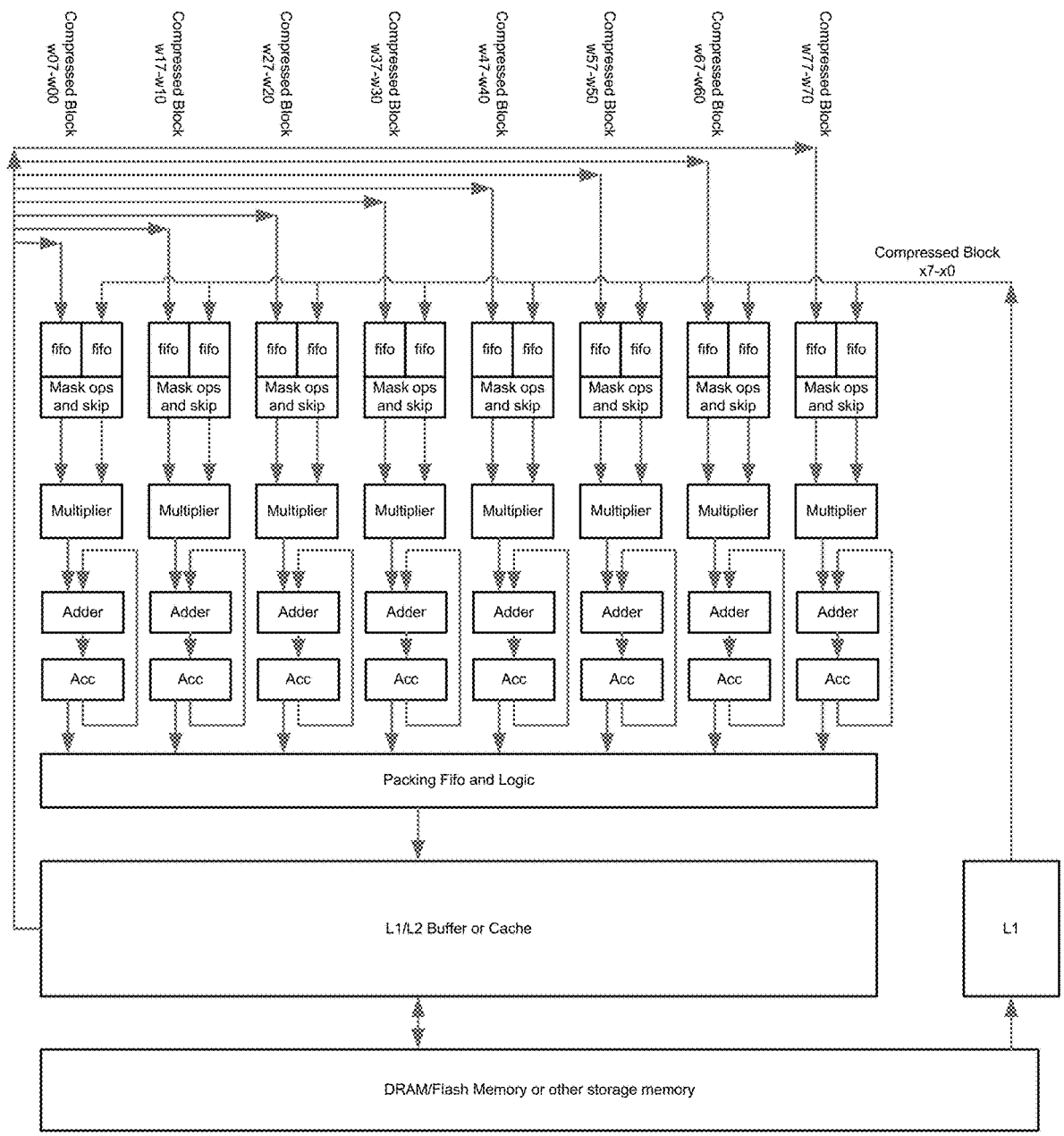

FIGS. 16-18 illustrate architectures, in accordance with an embodiments of the present invention.

Figure 19:
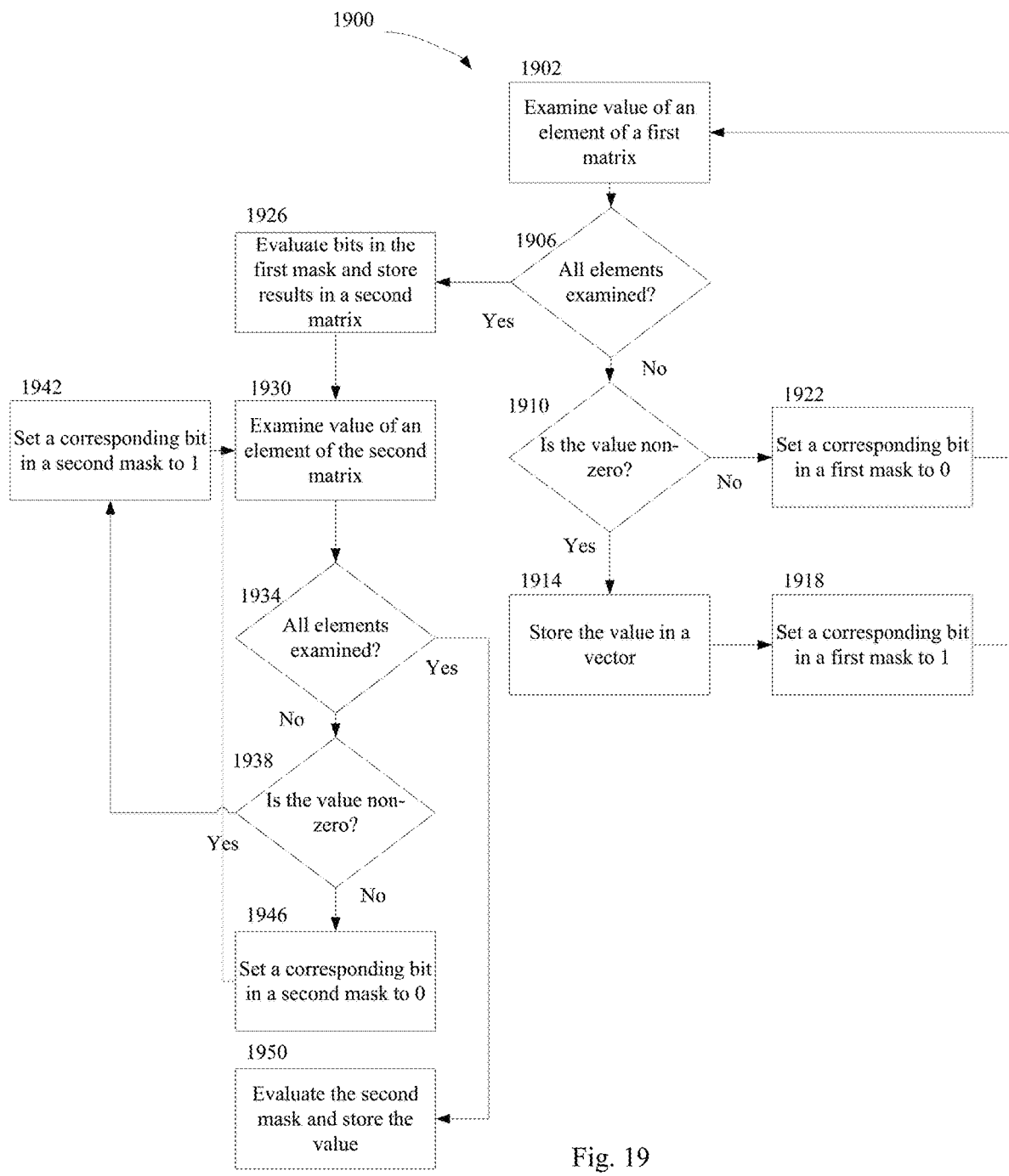
FIG. 19 illustrates an exemplary method for compression, in accordance with an embodiment of the present invention.

FIG. 19 illustrates an exemplary method for compression, in accordance with an embodiment of the present invention. In the present embodiment, a process 1900 starts where elements of matrix 405 may be examined in a step 1902. In a step 1906 it may be determined if all the elements have been examined. If they have not all been examined, then in a step 1910 it may be determined if the examined element is non-zero. If the value is non-zero, then in a step 1914 the value of the element may be stored in vector 410 and in a step 1918, a corresponding bit of first mask 425 may be assigned a value of 1. The process may then return to step 1902. If the value of the element is zero, the corresponding bit of first mask 425 may be assigned a value of 0. In other embodiments, the values of the mask bits may be reversed where, without limitation, a 1 corresponds to a zero element and a 0 corresponds to a non-zero element. The process may then return to step 1902. If in step 1906 it is determined that all the elements have been examined, then in a step 1926 the bits of the first mask are evaluated and stored in a second matrix 530. In a step 1930 elements of second matrix 530 may be examined. In a step 1934 it may be determined if all the elements have been examined. If they have not all been examined, then in a step 1938 it may be determined if the examined element is non-zero. If the value is non-zero, then in a step 1942 a corresponding bit of second mask 535 may be assigned a value of 1. The process may then return to step 1930. If the value of the element is zero, the corresponding bit of second mask 535 may be assigned a value of 0. The process may then return to step 1930. If in step 1934 it is determined that all the elements have been examined, then in a step 1950 the bits of the second mask are evaluated and stored in 537.

Figure 20:
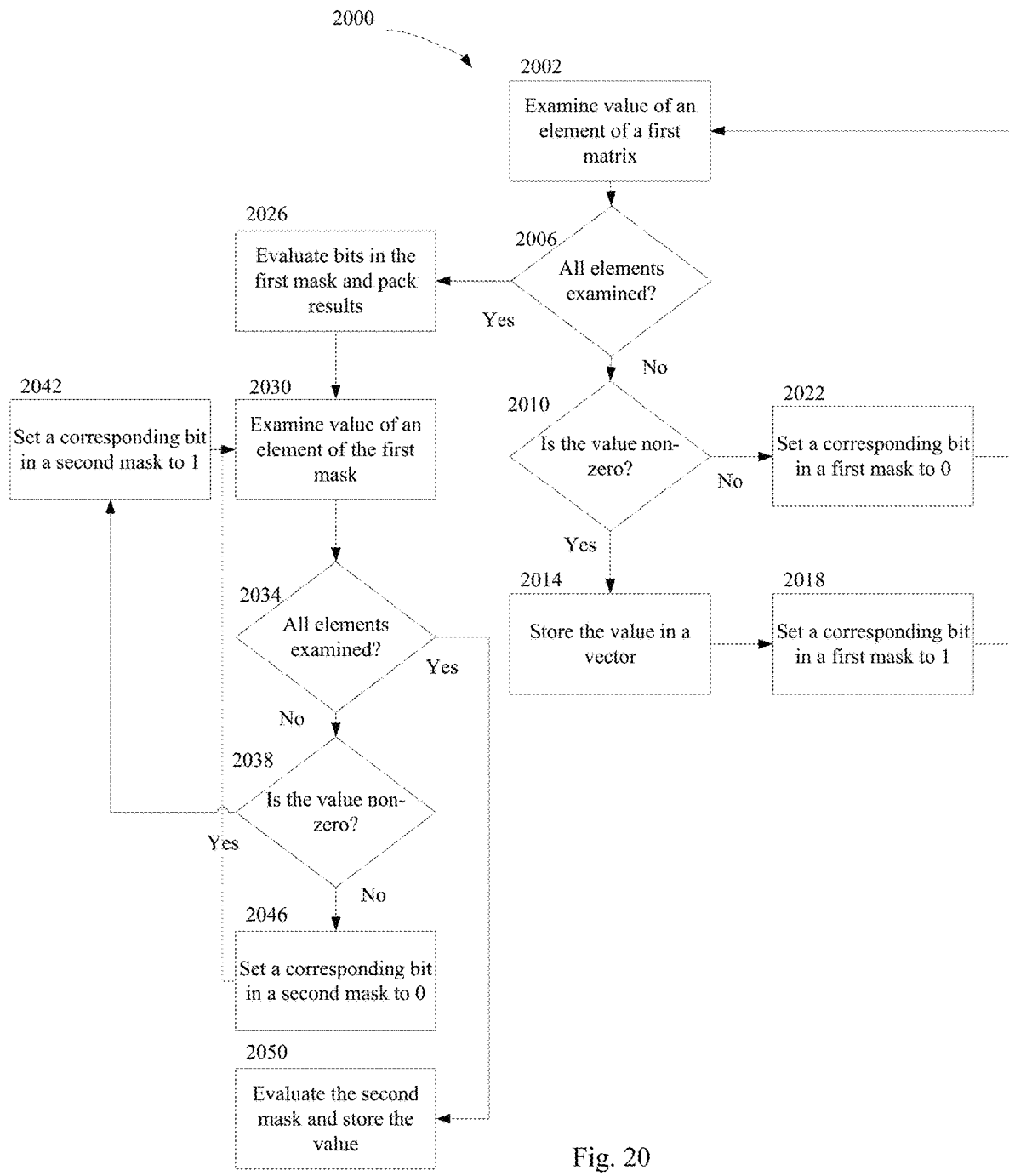
FIG. 20 illustrates an exemplary method for compression, in accordance with an embodiment of the present invention.

FIG. 20 illustrates an exemplary method for compression, in accordance with an embodiment of the present invention. In the present embodiment, a process 2000 starts where elements of matrix 405 may be examined in a step 2002. In a step 2006 it may be determined if all the elements have been examined. If they have not all been examined, then in a step 2010 it may be determined if the examined element is non-zero. If the value is non-zero, then in a step 2014 the value of the element may be stored in one of vectors 645, 650, 655, and 660 and in a step 2018, a corresponding bit of first mask 625 may be assigned a value of 1. The process may then return to step 2002. If the value of the element is zero, the corresponding bit of first mask 625 may be assigned a value of 0. In other embodiments, the values of the mask bits may be reversed where, without limitation, a 1 corresponds to a zero element and a 0 corresponds to a non-zero element. The process may then return to step 2002. If in step 2006 it is determined that all the elements have been examined, then in a step 2026 the bits of the first mask are evaluated and packed in a vector 640. In a step 2030 elements of first mask 625 may be examined. In a step 2034 it may be determined if all the elements have been examined. If they have not all been examined, then in a step 2038 it may be determined if the examined element is non-zero. If the value is non-zero, then in a step 2042 a corresponding bit of second mask 535 may be assigned a value of 1. The process may then return to step 2030. If the value of the element is zero, the corresponding bit of second mask 535 may be assigned a value of 0. The process may then return to step 2030. If in step 2034 it is determined that all the elements have been examined, then in a step 2050 the bits of the second mask are evaluated and stored in 537.

Figure 21:
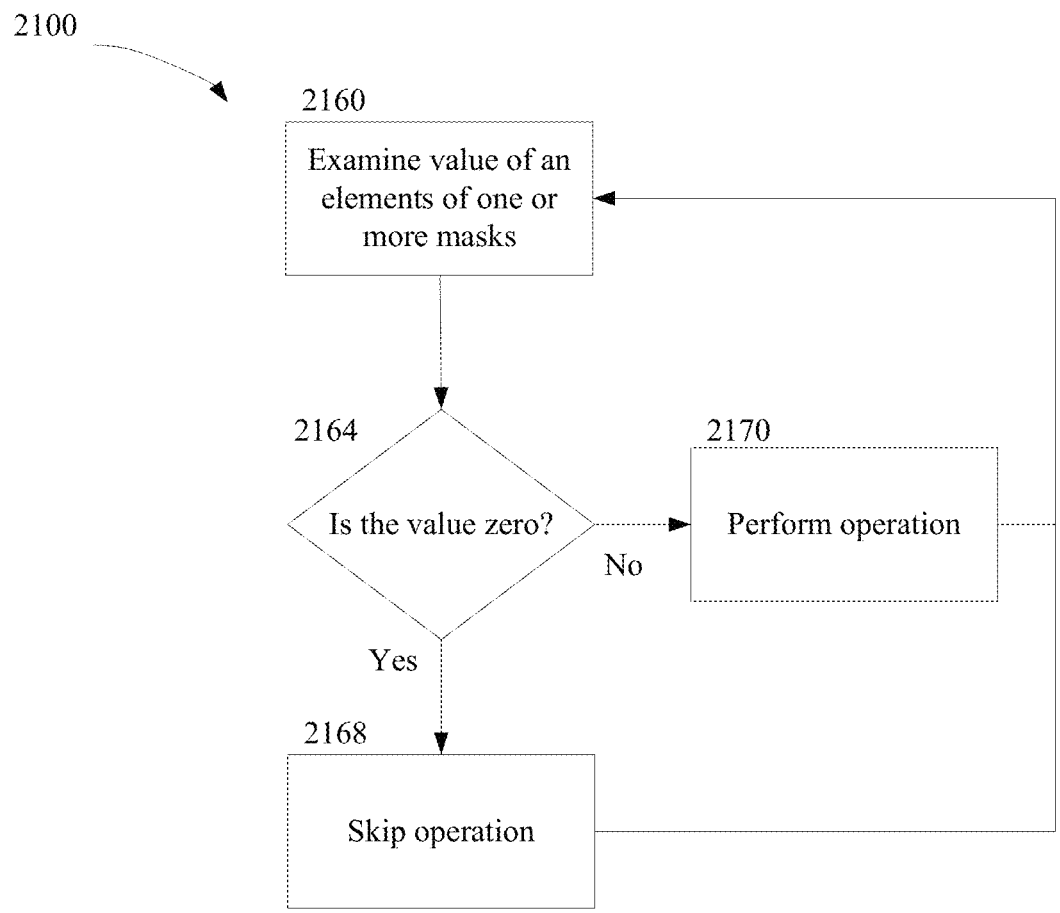
FIG. 21 illustrates an exemplary method for compression, in accordance with an embodiment of the present invention.

FIG. 21 illustrates an exemplary method for compression, in accordance with an embodiment of the present invention. In the present embodiment, a process 2100 starts where values of one or more masks are examined in a step 2160. In a step 2164 it is determined if a value is zero. If the value is zero then in a step 2168 an operation is skipped and the process returns to step 2160. If the value is not zero, then the operation is performed and the process returns to step 2160. In other embodiments, the values of the mask bits may be reversed where, without limitation, a 1 corresponds to a zero element and a 0 corresponds to a non-zero element.

Those skilled in the art will readily recognize, in light of and in accordance with the teachings of the present invention, that apply this method to CPU, GPU, Neural Processor Unit (NPU), DSP and fix function logic to speed up the neural network processing in less power consumption. Teachings of the present invention may also be applied to handheld device like smart phone, VR/AR device driverless car, drone and robot to run in an energy saving method.

Those skilled in the art will readily recognize, in light of and in accordance with the teachings of the present invention, that any of the foregoing steps and/or system modules may be suitably replaced, reordered, removed and additional steps and/or system modules may be inserted depending upon the needs of the particular application, and that the systems of the foregoing embodiments may be implemented using any of a wide variety of suitable processes and system modules, and is not limited to any particular computer hardware, software, middleware, firmware, microcode and the like. For any method steps described in the present application that can be carried out on a computing machine, a typical computer system can, when appropriately configured or designed, serve as a computer system in which those aspects of the invention may be embodied.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112 (6) when such corresponding structures are not explicitly disclosed in the foregoing patent specification. Therefore, for any invention element(s)/structure(s) corresponding to functional claim limitation(s), in the below claims interpreted under 35 USC § 112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing data compression according to the present invention will be apparent to those skilled in the art. Various aspects of the invention have been described above by way of illustration, and the specific embodiments disclosed are not intended to limit the invention to the particular forms disclosed. The particular implementation of the data compression may vary depending upon the particular context or application. By way of example, and not limitation, the data compression described in the foregoing were principally directed neural networks implementations; however, similar techniques may instead be applied to any devices processing large data arrays, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

What is claimed is:

1. A method comprising the steps of:
   examining, by a computer processor, elements of a first matrix sequentially to identify values associated with the examined elements of the first matrix;
   setting a bit of a first mask to a first value if an identified value is zero or to a second value if the identified value is non-zero;
   packing the non-zero values in a first vector, wherein bits of the first mask determine the positions of packed values;
   generating a second mask, wherein bits of the second mask determine operations on packed values;
   aggregating bits in the first mask;
   storing results of said aggregating in a second matrix;
   examining elements of the second matrix sequentially to identify values associated with the examined elements of the second matrix;
   and setting a bit of a second mask to a third value if the identified value is zero or to a fourth value if the identified value is non-zero.

2. The method as recited in claim 1, in which the first mask and packed values are separated in different formats and surfaces.

3. The method as recited in claim 2, wherein the surfaces are selected from a group consisting of: a mask surface; and a packed values surface.

4. The method as recited in claim 2, wherein the surfaces include a block length surface.

5. The method as recited in claim 1 further comprising:
   skipping operations on packed values at least partially based on values of the first mask.

6. The method as recited in claim 1 further comprising:
   skipping operations on packed values at least partially based on values of the first mask and nodes in a neural network.

7. The method as recited in claim 1 further comprising:
   skipping operations on packed values at least in part on values of the first mask and the second mask.

8. The method as recited in claim 1, in which said generating further comprises:
   aggregating bits in the second mask; and
   storing results of said aggregating bits in the second mask.

9. The method as recited in claim 1, in which said generating further comprises:
   aggregating bits in the first mask;
   packing results of said aggregating bits in the first mask in a second vector;
   examining elements of the first mask sequentially to identify values associated with the examined elements of the first matrix;
   setting a corresponding bit of a second mask to a third value if the identified value of the examined elements of the first mask is or to a fourth value if the identified value of the examined elements of the first mask is non-zero; and
   aggregating bits in the second mask; and
   storing results of aggregating bits in the second mask.

10. A system comprising:
    a computer processor;
    a module operable to examine elements of a first matrix sequentially to identify values associated with the examined elements of the first matrix;
    a module operable to set a bit of a first mask to a first value if an identified value is zero or to a second value if the identified value is non-zero;
    a module operable to pack the non-zero values in a first vector, wherein bits of the first mask determine operations on packed values;
    a module operable to generate a second mask, wherein bits of the second mask determine operations on packed values;
    a module operable to evaluate bits in the first mask; a module operable to store results of said aggregating in a second matrix;

and a module operable to examine elements of the second matrix sequentially to identify values associated with the examined elements of the second matrix;

and a module operable to set a bit of a second mask to a third value if the identified value is zero or to a fourth value if the identified value is non-zero.

11. A non-transitory computer-readable storage medium with an executable program stored thereon, wherein the program instructs one or more processors to perform the following steps:

examining, by a computer processor, elements of a first matrix sequentially to identify values associated with the examined elements of the first matrix;

setting a bit of a first mask to a first value if an identified value of the first matrix is zero or to a second value if the identified value of the first matrix is non-zero;

packing the non-zero values in a first vector, wherein bits of the first mask determine operations on packed values;

generating a second mask, wherein bits of the second mask determine operations on packed values;

aggregating bits in the first mask;

storing results of said aggregating in a second matrix;

examining elements of the second matrix sequentially to identify values associated with the examined elements of the second matrix;

setting a bit of a second mask to a third value if the identified value of the second matrix is zero or to a fourth value if the identified value is non-zero;

and aggregating bits in the second mask;

and storing results of aggregating bits in the second mask.

12. The program instructing the one or more processors as recited in claim 11, in which the first mask and packed values are separated in different formats and surfaces.

13. The program instructing the one or more processors as recited in claim 11, in which the surfaces at least comprises a mask surface and a packed values surface.

14. The program instructing the one or more processors as recited in claim 11, in which the surfaces further comprises a block length surface.

15. The program instructing the one or more processors as recited in claim 11, in which operations on packed values are skipped at least based in part on values of the first mask.

16. The program instructing the one or more processors as recited in claim 11 in which operations on packed values are skipped at least based in part on values of the first mask and the second mask.

17. A non-transitory computer-readable storage medium with an executable program stored thereon, wherein the program instructs one or more processors to perform the following steps:

examining, by a computer processor, elements of a first matrix sequentially to identify values associated with the examined elements of the first matrix;

setting a corresponding bit of a first mask to a first value if an identified value of the first matrix is zero or to a second value if a the identified value of the first matrix value is non-zero;

packing the non-zero values in a first vector, wherein bits of at least the first mask determine operations on packed values;

generating at least a second mask, wherein bits of at least the second mask determine operations on packed values;

valuating bits in the first mask;

packing results of said aggregating bits in the first mask in a second vector; examining elements of the first mask sequentially;

setting a bit of a second mask to a third value if a the identified value of the examined elements of the first mask is zero or to a fourth value if the identified value of the examined elements of the first mask is non-zero;

and aggregating bits in the second mask;

and storing results of aggregating bits in the second mask.

* * * * *